US006978714B2

(12) United States Patent
Saiki et al.

(10) Patent No.: US 6,978,714 B2
(45) Date of Patent: Dec. 27, 2005

(54) SOLDER PASTE PRINTING METHOD, SOLDER PASTE PRINTING APPARATUS, AND METHOD FOR MANUFACTURING A WIRING SUBSTRATE HAVING SOLDER-PRINTED LAYERS

(75) Inventors: Hajime Saiki, Aichi (JP); Michitoshi Nakata, Tajimi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 32 days.

(21) Appl. No.: 10/687,626

(22) Filed: Oct. 20, 2003

(65) Prior Publication Data

US 2004/0134363 A1 Jul. 15, 2004

(30) Foreign Application Priority Data

Oct. 18, 2002 (JP) .................................... P. 2002-304848
Sep. 25, 2003 (JP) .................................... P. 2003-333578

(51) Int. Cl.[7] ................................................ B41M 1/12
(52) U.S. Cl. ....................................... 101/129; 101/123
(58) Field of Search ................................ 101/114, 123, 101/124, 127.1, 129; 118/213, 406

(56) References Cited

U.S. PATENT DOCUMENTS 4,254,707 A * 3/1981 Lambert et al. ............ 101/123
4,781,114 A * 11/1988 Ericsson ..................... 101/123
5,553,538 A * 9/1996 Freitag ...................... 101/123
5,894,793 A * 4/1999 Sakai ......................... 101/123
5,948,466 A * 9/1999 Sarashina et al. ............. 427/97
6,170,394 B1 * 1/2001 Kinoshita ................... 101/129

FOREIGN PATENT DOCUMENTS

JP 2000-177098 A 6/2000
JP 2002-76600 A 3/2002
JP 2002-86673 A 3/2002
JP 2002-134894 A 5/2002
JP 2002-134895 A 5/2002
JP 2002-192688 A 7/2002

* cited by examiner

*Primary Examiner*—Ren Yan
(74) *Attorney, Agent, or Firm*—Sughrue Mion, PLLC

(57) ABSTRACT

A solder paste printing method comprising the steps of dispose a plate-shaped mask having a plurality of through holes formed to correspond to a plurality of connection terminals, over a printed face of a substantially polygonal wiring substrate having a side of a length of at least 300 mm and having the connection terminals in the printed face; forming solder-printed layers by moving a squeezee along an outer face of the mask while holding the squeezee in contact with the outer face of the mask, thereby to fill the through holes with a solder paste; and detaching the mask by disengaging one side edge of the mask disposed over the printed face of the wiring substrate, relatively from the printed face.

15 Claims, 4 Drawing Sheets

SOLDER PASTE PRINTING METHOD, SOLDER PASTE PRINTING APPARATUS, AND METHOD FOR MANUFACTURING A WIRING SUBSTRATE HAVING SOLDER-PRINTED LAYERS

FIELD OF THE INVENTION

The present invention relates to a solder paste printing method, a solder paste printing apparatus, and a method for manufacturing a wiring substrate having solder-printed layers.

BACKGROUND OF THE INVENTION

As a method for jointing electronic parts or the like to connection terminals over a wiring substrate, there has been known in the prior art a method using solder bumps (or protruding electrodes). These solder bumps are usually formed by printing a solder paste on a plurality of connection terminals formed on the printed face of the wiring substrate, with a solder paste printing apparatus, and by melting the solder-printed layers by a re-flow.

The procedure of printing the solder paste on the connection terminals with the solder paste printing apparatus of the prior art is as follows.

At first, the wiring substrate is horizontally held on the upper face of a table or a wiring substrate holder. Next, a solder paste printing plate-shaped mask is arranged over the printed face of the wiring substrate. In this mask, there are arranged a plurality of through holes, which are formed to correspond to the connection terminals. Next, a squeezee is brought into contact with the upper face of the mask and is fed on its forward side with a solder paste. In this state, the squeezee is moved along the upper face of the mask. Then, the through holes are filled with the solder paste by the squeezee so that solder-printed layers are formed on the connection terminals. By finally lowering the table as a whole vertically, the mask is detached from the printed face thereby to disengage the solder-printed layers from the through holes (as referred to JP-A-2002-76600 (Paragraph 0008, FIG. 1(D) etc.) and JP-A-2000-177098 (Paragraph 0018, FIG. 1 etc.), for example).

SUMMARY OF THE INVENTION

In the aforementioned solder paste printing apparatus of the prior art, however, there is adopted the method (as will be conveniently called the "vertical detaching method"), by which the mask and the wiring substrate are vertically detached to effect the detachment without inclining the mask and the wiring substrate especially. Therefore, a problem arises in that the solder-printed layers get out of shape at the detaching time or in that the size or height of the solder-printed layers easily disperses.

Therefore, we have keenly investigated and found out that the above-specified problems are caused by the fact that the solder paste printing apparatus of the prior art adopted the vertical detaching method. From this finding, therefore, the method has been changed to a method (as will be conveniently called the "non-vertical detaching method) of performing the detachment not vertically, so that relatively homogeneous solder-printed layers can be formed. It has also been found out that the solder-printed layers cannot be homogeneously formed on a large-sized wiring substrate having one side of a length more than 300 mm even by the printing apparatus adopting the non-vertical detaching method, and that the dispersion may be caused by the position in the printed face. It is, therefore, necessary to search for the proper printing conditions of the case using such printing apparatus.

The invention has been conceived in view of the above-specified problems and has an object to provide a solder paste printing method capable of forming solder-printed layers of a uniform height over a large-sized wiring substrate, a solder paste printing apparatus, and a method for manufacturing a wiring substrate having solder-printed layers by using the same.

As means for solving the aforementioned problems, moreover, there is provided a solder paste printing method comprising: the step of arranging a plate-shaped mask having a plurality of through holes formed to correspond to a plurality of connection terminals, over a printed face of a substantially polygonal wiring substrate having one side of a length of at least 300 mm and having the connection terminals in the printed face; the step of forming solder-printed layers by moving a squeezee along the outer face of the mask while holding the squeezee in contact with the outer face of the mask, thereby to fill the through holes with a solder paste; and the step of detaching the mask by disengaging one side edge of the mask arranged over the printed face of the wiring substrate, relatively from the printed face.

As another solving means, moreover, there is provided a method for manufacturing a wiring substrate having solder-printed layers, comprising: the step of arranging a plate-shaped mask having a plurality of through holes formed to correspond to a plurality of connection terminals, over a printed face of a substantially polygonal wiring substrate having one side of a length of at least 300 mm and having the connection terminals in the printed face; the step of forming solder-printed layers by moving a squeezee along the outer face of the mask while holding the squeezee in contact with the outer face of the mask, thereby to fill the through holes with a solder paste; and the step of detaching the mask by disengaging one side edge of the mask arranged over the printed face of the wiring substrate, relatively from the printed face.

In the so-called "vertical detaching method", peeling forces are applied all at once to the solder-printed layers at the detaching time. Therefore, the magnitudes of the peeling forces are different among positions in the printed face so that the solder-printed layers are easily dispersed. In the aforementioned method, on the contrary, there is adopted the so-called "non-vertical detaching method", in which the mask is detached by disengaging one side edge of the mask from the printed face. Therefore, the solder-printed layers are peeled sequentially from one side edge to the other side edge of the mask, so that the magnitudes of the peeling forces can be kept constant irrespective of the positions in the printed face. In the large-sized wiring substrate, therefore, the solder-printed layers can be formed with a uniform thickness. Moreover, the wiring substrate manufactured by such solder paste printing method has such a high quality as is excellent in connection reliability.

Here, the plate-shaped mask has edges. When the flat-shaped mask is cut in a plane extending through the mask center and normal to the mask thickness direction, the regions (or corners) near the sides largely spaced in the mask face direction from the mask center portion are the portions, which are called the edges of the mask in the invention. In this case, the edges of the mask are located at the two ends of the cut plane, and one of them is the "one side edge of the mask". The edge of the mask may be expressed as the "end of the mask" or the "margin of the mask", and one side edge of the mask may be expressed as the "one side end of the mask" or the "one side margin of the mask".

Here, the "plate-shaped mask" is more specified by a plate-like mask having an outer face and an inner face. This "inner face" implies the face which is directed to the printed face side of a printed article at the mask using time (or printing time). On the other hand, the "outer face" is located on the other side of the inner face and implies the face which is not directed to the printed face side of the printed article at the mask using time.

As another means, moreover, there is provided a solder paste printing apparatus comprising: a wiring substrate holder for holding a substantially polygonal wiring substrate having one side of a length of at least 300 mm and a plurality of connection terminals in a printed face; a plate-shaped mask having a plurality of through holes formed to correspond to the connection terminals and arranged over the printed face of the wiring substrate; a squeezee for moving along the outer face of the mask while being held in contact with the outer face of the mask, to fill the through holes with a solder paste thereby to form solder-printed layers; and detachment means for disengaging one side edge of the mask arranged over the printed face of the wiring substrate, relatively from the printed face thereby to detach the mask.

In the printing apparatus thus constructed, therefore, the detachment means is driven after the solder paste was printed by moving the squeezee, so that one side edge of the mask can be relatively disengaged from the printed face. Therefore, the mask detachment by the non-vertical detaching method can be realized relatively easily.

Here, the wiring substrate to be printed at the solder paste printing time has to be a substantially polygonal wiring substrate having one side of a length of 300 mm or more and having a plurality of connection terminals on the printed face. This is because the problem to be solved by the invention easily occurs when the large-sized wiring substrate having the aforementioned characteristics is to be manufactured. This problem more easily occurs in case the substantially rectangular wiring substrate has one side of a length of 350 mm or more, especially 400 mm or more. Here, one side length of the wiring substrate is usually preferred to be 1,000 mm or less for handling the wiring substrate. The "substantially polygonal wiring substrate" implies a wiring substrate having a polygonal shape (e.g., a substantially triangular shape, a substantially rectangular shape, a substantially pentagonal shape, or a substantially hexagonal shape), as seen in the thickness direction. Of these, it is preferred that the wiring substrate presents a substantially rectangular shape when viewed in the thickness direction. Here, the "substantially rectangular shape" implies a rectangular shape such as a square shape, a trapezoidal shape or a rhombic shape, but naturally includes such one of these shapes as has its corner portion partially chamfered.

Moreover: printed face of the wiring substrate is covered with a solder resist having openings; the solder-printed layers are flip chip bumps formed over the connection terminals exposed through the openings; and the protrusion height of the flip chip bumps from the surface of the solder resist is at least 20 $\mu$m.

In the case of the flip chip bumps, the bump upper faces have to be protruded to some extent from the solder resist surface. In order to retain the volume of the bumps (or the solder printed layers) large to some extent, more specifically, the printed thickness of the solder paste has to be set a little more (that is, the mask thickness has to be set larger thereby to set the paste-filled spaces in the through holes a little larger). When the large-sized wiring substrate thus constructed is to be manufactured, moreover, the problem (i.e., the dispersion of the solder-printed layer in the printed face) to be solved by the invention is seriously liable to occur.

Moreover, the solder resist to cover the printed face has a thickness of 5 $\mu$m or more, especially 10 $\mu$m or more. Here, the solder resist usually has a thickness of 100 $\mu$m or less. As the solder resist becomes the thicker, the solder paste to be filled becomes the more. It is, therefore, necessary to set the printed quantity of the solder paste a little more. When the large-sized wiring substrate thus constructed is to be manufactured, moreover, the problem (i.e., the dispersion of the solder-printed layer in the printed face) to be solved by the invention is seriously liable to occur.

It is preferred for the better mask detachment that the mask thickness is 70 $\mu$m or less, especially 50 $\mu$m or less. It is preferred for retaining the solder volume that the mask thickness is 20 $\mu$m or more.

Here will be described a procedure of manufacturing the wiring substrate having the solder-printed layers by the method and apparatus of the aforementioned solving means.

The aforementioned large-sized wiring substrate is held at first on the wiring substrate holder at the printing time. At this time, the printed face of the wiring substrate is directed in a direction (e.g., upward) to the mask or the like. Here, the wiring substrate holder may be so constructed as can be lifted up and down by holder drive means. With this construction, it is possible to replace the wiring substrate easily at the printing time.

Next, the mask is arranged over the printed face of the wiring substrate. This mask has a plurality of through holes formed to correspond to a plurality of connection terminals. The mask may be brought into contact with the printed face at this point of time or later at a squeezee moving time. At this time, the inner face of the mask and the printed face of the wiring substrate take a substantially parallel positional relation. In other words, the size of the gap between the inner face of the mask and the printed face of the wiring substrate is substantially equal no matter whether it might be located near the movement starting position or the movement ending position of the squeezee.

Although the mask thickness is not especially limited, on the other hand, it is set so large as to retain the protrusion height from the solder resist surface, as has been described hereinbefore, in case the solder-printed layers are the flip chip bumps.

Next, the squeezee is brought into contact with the outer face of the mask. The squeezee to be used may have a blade shape or a roller shape. Here, the squeezee is driven in a predetermined direction along the outer face of the mask by squeezee driving means.

In this case, the moving speed of the squeezee is desirably at 20 mm/sec. or less, more desirably at 17 mm/sec. or less, most desirably at 10 mm/sec. to 17 mm/sec. If this moving speed is excessively high, the parting failure of the solder paste may be unable to be reliably prevented. If the moving speed is excessively low, on the contrary, the productivity drops although the parting failure of the solder paste is reliably eliminated.

On the other hand, the printing pressure of the squeezee is desirably at 7.5 Kgf or more, more desirably at 8.15 Kgf or more, most desirably at 8.15 Kgf to 9.15 Kgf. If this printing pressure is excessively low, the filling properties of the solder paste may be deteriorated to make it impossible to prevent the parting failure of the solder paste reliably. If the printing pressure is excessively high, on the contrary, the stress to be applied to the wiring substrate through the mask may be increased to break the wiring substrate, as the case may be, although the parting failure of the solder paste is reliably eliminated. Moreover, the wears of the parts are accelerated by the increase in the sliding resistance between the mask and the squeezee.

In the aforementioned contacting state, moreover, the squeezee is moved in the predetermined direction along the outer face of the mask so that the through holes are filled with the solder paste to form the solder-printed layers of a predetermined height.

Next, the mask is detached by disengaging one side edge of the mask, as arranged over the printed face of the wiring substrate, relatively from the printed face. This detaching action may be mechanically done by using detachment means, for example. It is desired that the one side edge of the mask to be disengaged by the detachment means is located at the mask on the movement starting side of the squeezee. If the construction is made by disengaging the movement ending side of the squeezee in the mask, for example, the squeezee may interfere at the detaching time. In order to avoid this interference, an additional structure may be required for retracting the squeezee. According to the aforementioned construction, on the contrary, the structure for the squeezee retraction is not needed to avoid the complicated construction of the apparatus.

Here, the detachment means should not be especially limited but is desirably constructed to include pressure means for pushing one side edge of the mask thereby to disengage the one side edge of the mask relatively from the printed face. This is because the non-vertical detaching action can be realized with the relatively simple construction by using the pressure means. Here upon the realization of the non-vertical detaching action, there can be conceived a construction for driving the wiring substrate holder side. In this case, however, the holder driving means may be complicated and large-sized.

Here, the detachment means is desirably constructed to include pressure means for pushing one side edge of the mask arranged substantially horizontally, upward to disengage the one side edge of the mask relatively from the printed face.

The pressure means can be exemplified, although not especially limitative, by a preferred specific example such as an actuator (e.g., an air cylinder or a hydraulic cylinder) using a fluid pressure as a drive source, or an actuator (e.g., a solenoid or a motor) using an electric drive source. The pressure means may be constructed to abut not only at all times against the mask but also only at an action time.

In case the mask is constructed to include a mask plate having a plurality of through holes and a plate supporting frame for supporting the mask plate, moreover, the pressure means may push either the mask plate or the plate supporting frame. From the viewpoint of realizing the avoidance of the application of a stress to the mask plate or the detailed setting of a pushing stroke, however, the pressure means is desirably constructed to push the plate supporting frame.

Moreover, the pressure means is preferably arranged under the one mask side and constructed to push the one mask side upward. In this case, the gravitation force acts in the opposite direction of the pushing direction so that the pressure means can be quickly returned to the initial state after the non-vertical detaching action and can be simplified in construction.

Here, the detaching action is to push the squeezee movement starting side of the mask and is desirably started after the squeezee passed through three quarters or more of the through hole forming region in the mask, more desirably started after squeezee passed through four fifths or more, or most desirably after the squeezee passed completely. This is because if the starting timing of the detaching action is excessively early, the dispersion of the solder-printed layers becomes large among the positions in the printed face.

The time period necessary for the detaching action is desirably for 3.0 sec. or longer, more desirably for 3.0 secs. to 60.0 secs., most desirably for 4.0 secs. to 7.5 secs. Moreover, the speed to push one side of the mask at the detaching time is desirably at 0.9 mm/sec. or less, more desirably at 0.7 mm/secs. or less, most desirably at 0.1 mm/sec. to 0.7 mm/sec.

If the aforementioned time period is excessively short (or if the pushing speed is excessively high), the magnitude of the peeling force is easily different among the positions in the printed face so that the shape of the solder-printed layers in the squeezee moving direction disperses. More specifically, the solder-printed layers located at the central portion of the wiring substrate are dome-shaped. If the time period is excessively long (or if the pushing speed is excessively low), the productivity drops.

Moreover, the size of the gap between the inner face of the mask and the printed face of the wiring substrate after the detaching action was completed is desirably 3 mm or more in the vicinity of the movement starting position of the squeezee and 2 mm or more in the vicinity of the movement ending position of the squeezee. This is because if the size of the gap is smaller than the aforementioned range, the solder-printed layers cannot be reliably detached from the mask in the entirety of the squeezee moving direction.

DETAILED DESCRIPTION OF THE INVENTION

With reference to FIG. 1 to FIG. 9, here will be described in detail a solder paste printing apparatus according to one specific embodiment of the invention, and a wiring substrate manufacturing method using the apparatus.

Figure 1:
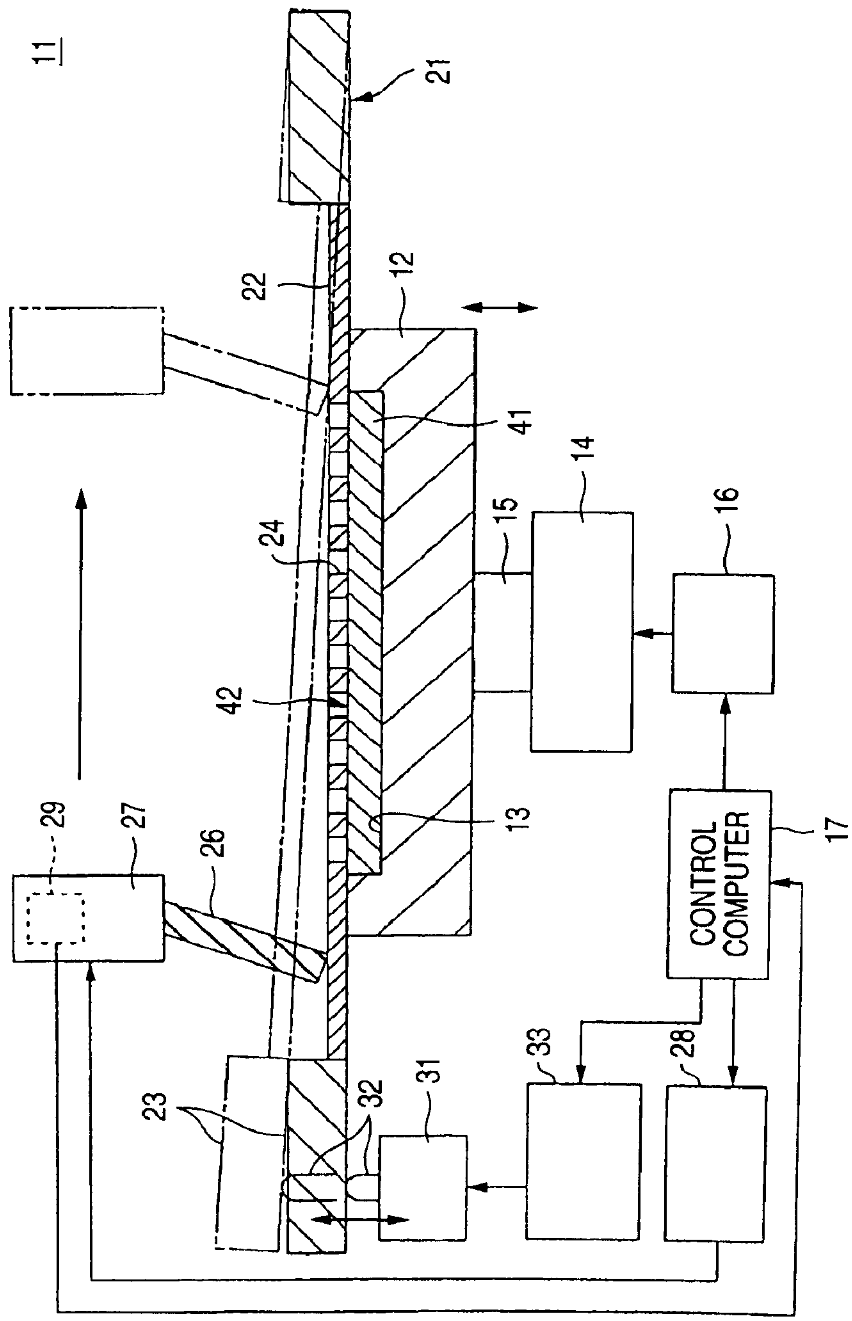
FIG. 1 is a schematic diagram showing the entirety of a solder paste printing apparatus of one embodiment embodying the invention.

FIG. 1 is a specific diagram showing the entirety of a paste printing apparatus to be used in this embodiment. This solder paste printing apparatus 11 is provided with a table 12 (or a wiring substrate holder) for holding a wiring substrate 41 horizontally in a positioned state. In the upper face of the table 12, there is formed a holding recess 13, which is so sized as to house the large-sized square wiring substrate 41 (i.e., the wiring substrate 41 having one side length of 300 mm or more). At a position under the table 12, there is arranged an electric cylinder 14 acting as holder driving means. The table 12 is supported at the central portion of its lower face by such a rod portion 15 of the electric cylinder 14 as is extended upward. This electric cylinder 14 is electrically connected with a control computer 17 through a motor driver circuit 16 acting as the holder driving means. When a predetermined control signal is outputted from the control computer 17, therefore, the not-shown motor in the electric cylinder 14 is driven through the motor driver circuit 16. As a result, the rod portion 15 of the electric cylinder 14 is extended and contracted so that the table 12 is accordingly moved in the upward/downward direction (or in the X-axis direction) of FIG. 1. As a result, the wiring substrate 41 held by the table 12 goes up and down.

This solder paste printing apparatus 11 is provided with a mask 21 at a position above the table 12. This mask 21 is constructed to include a mask plate 22 and a plate supporting frame 23 for supporting the mask plate 22.

This mask plate 22 is made of a metal sheet (having a thickness of 40 $\mu$m) of stainless steel or the like and is formed into a rectangular shape in a top plan view. In the central portion of the mask plate 22, there are regularly formed a plurality of through holes 24, which have a substantially circular shape having a diameter of about 140 $\mu$m. These through holes 24 are formed to correspond to flip chip pads 43 (or connection terminals) or printed portions in a printed face on the wiring substrate 41. Here, the flip chip pads 43 in the wiring substrate 41 are formed into a substantially circular shape having a diameter of about 120 $\mu$m and are exposed (as referred to FIG. 6) to the outside through openings 45 of a solder resist 44 covering the printed face 42. In this embodiment, the solder resist 44 is set to have a thickness of about 20 $\mu$m to 30 $\mu$m. At the printing time, the mask plate 22 can be arranged over the printed face 42 of the wiring substrate 41. More specifically, the lower face of the mask plate 22 (or the inner face of the mask 21) can be arranged at the printing time substantially in close contact with the surface of the solder resist 44.

The plate supporting frame 23 is a square-framed metal member having a higher rigidity than that of the mask plate 22, and supports the outer peripheral portion of the mask plate 22. The plate supporting frame 23 is arranged at such a position as is horizontally extended from the upper face of the table 12.

This solder paste printing apparatus 11 is further provided with a squeezee 26 and squeezee driving means 27 at a position above the table 12. The squeezee 26 is made of hard rubber and supported on the lower end face of the squeezee driving means 27. The squeezee driving means 27 of this embodiment is means for moving the squeezee 26 in the upward/downward direction (or in the X-axis direction) of FIG. 1 and in the leftward/rightward direction (or in a Y-axis direction) of FIG. 1, and is constructed to include a pair of ball-screws (although not shown) utilizing motors. Each of these X-axis direction driving motor and Y-axis direction driving motor are electrically connected with the control computer 17 through a motor driver circuit 28. When a predetermined control signal is outputted from the control computer 17, therefore, the individual motors are driven through the motor driver circuit 28. As a result, the squeezee 26 acts in the X-direction and Y-direction. Here, the squeezee 26 is pushed by a predetermined pressure onto the upper face of the mask plate 22 (or onto the outer face of the mask 21). Moreover, the squeezee 26 is caused to fill and print a solder paste 47 by the action in the Y-direction. Here in this embodiment, as shown in FIG. 1, the lefthand end side of the mask plate 22 is located on the movement starting side of the squeezee 26, and the righthand side is located on the movement ending side of the squeezee 26.

Moreover, the squeezee driving means 27 is provided with a load cell 29 acting as a printing pressure measuring sensor. This load cell 29 is outputting a printing pressure measuring signal at all times to the control computer 17. On the basis of this printing pressure measuring value, the control computer 17 drives and controls the squeezee 26 under a constant printing pressure.

This solder paste printing apparatus 11 is provided with a mask lifter 31 having a pin 32 on its upper end face. The mask lifter 31 acting as pressure means (or detachment means) is constructed by attaching the pin 32 to the leading end of the rod portion of an electric cylinder utilizing a motor. This mask lifter 31 is arranged under the mask 21 on the movement starting side of the squeezee 26 so that the pin 32 is always made to abut against the lower face of the plate supporting frame 23. This mask lifter 31 is electrically connected with the control computer 17 through a motor driver circuit 33 acting as pressure means driving means. As the predetermined control signal is outputted from the control computer 17, therefore, the not-shown motor in the electric cylinder is driven through the motor driver circuit 33. As a result, the pin 32 is vertically protruded so that the plate supporting frame 23 (or one side edge of the mask 21) on the movement starting side of the squeezee 26 is lifted at a predetermined speed in the upward direction (or in the X-direction) of FIG. 1. As a result, one side of the mask 21, which is arranged over the printed face 42 of the wiring substrate 41, is detached from the printed face 42 by several millimeters.

Figure 6:
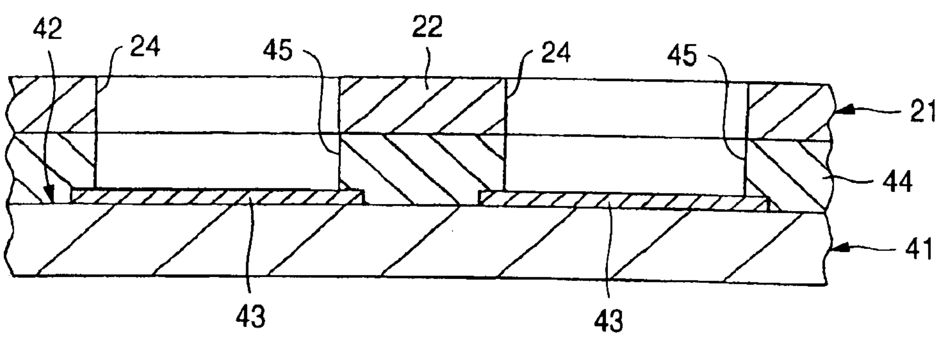
FIG. 6 is an enlarged section showing the essential portions of a wiring substrate and a mask before the solder paste printing.
Figure 7:
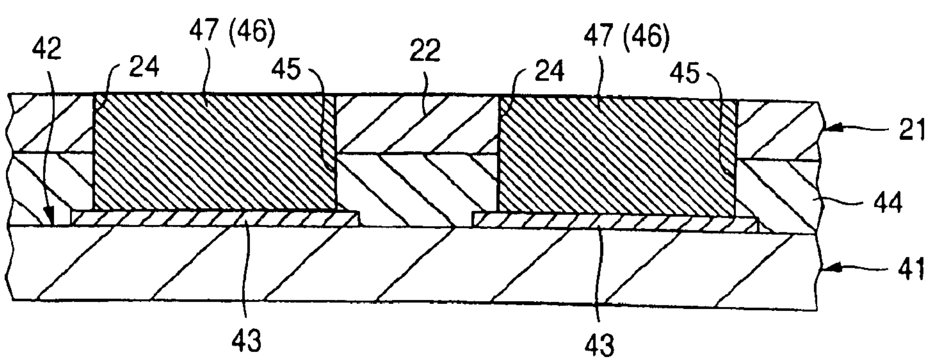
FIG. 7 is an enlarged section showing the essential portions of the wiring substrate and the mask after the solder paste printing.
Figure 8:
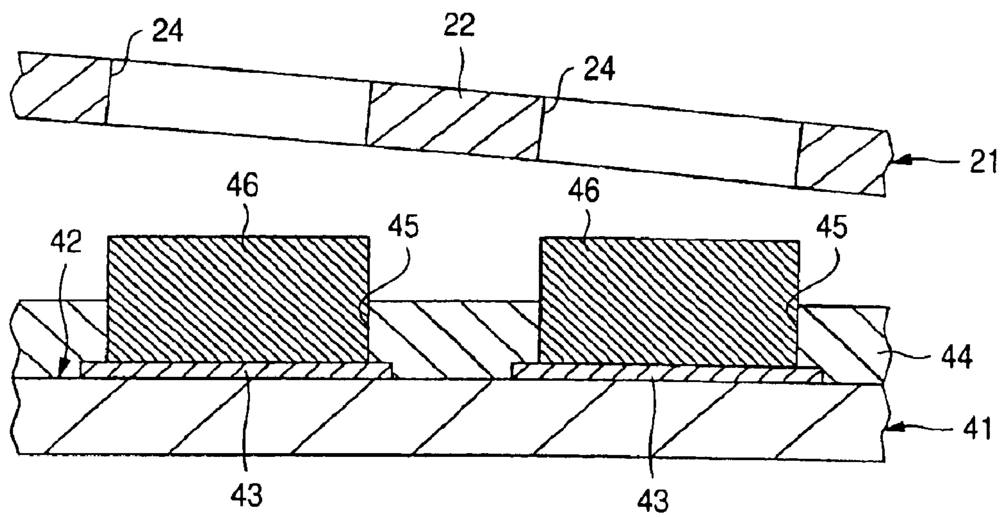
FIG. 8 is an enlarged section showing the essential portions of the wiring substrate and the mask after the detaching action was completed and FIG. 9 is an enlarged section showing the essential portion of the wiring substrate passed through a pressing step.
Figure 9:
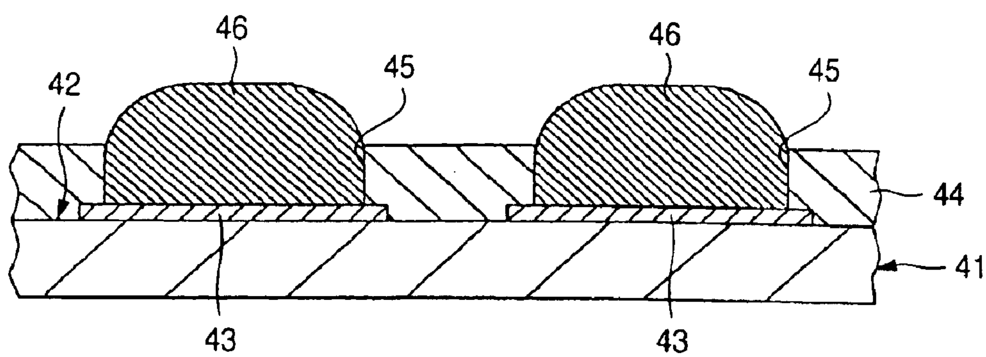

With reference to FIG. 2 to FIG. 9, here will be described a procedure for forming flip chip bumps 46 (or solder-printed layers) on the wiring substrate 41 by using the solder paste printing apparatus 11 thus far described. FIG. 2 to FIG. 5 are schematic diagrams of the essential portion of the solder paste printing apparatus 11. FIG. 6 to FIG. 8 are enlarged sectional diagrams of the essential portions of the wiring substrate 41 and the mask 21. FIG. 9 is an enlarged sectional diagram of the essential portion of the wiring substrate 41.

Figure 2:
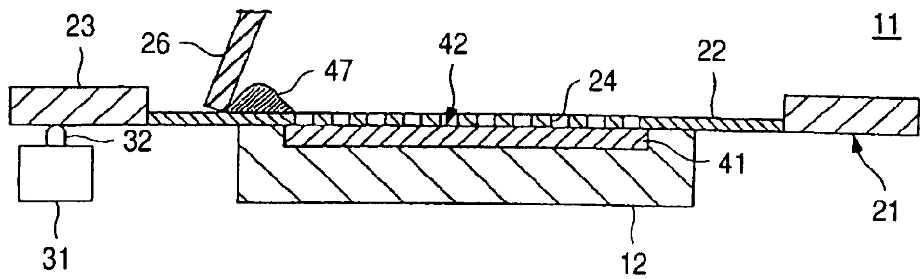
FIG. 2 is a schematic diagram showing the essential portion of the paste printing apparatus before a solder paste printing.
Figure 3:
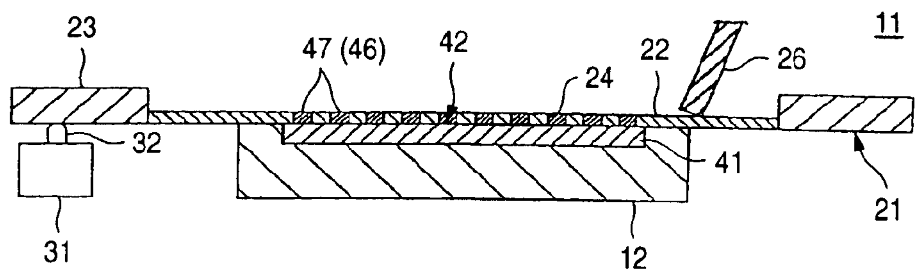
FIG. 3 is a schematic diagram showing the essential portion of the paste printing apparatus after the solder paste printing.
Figure 4:
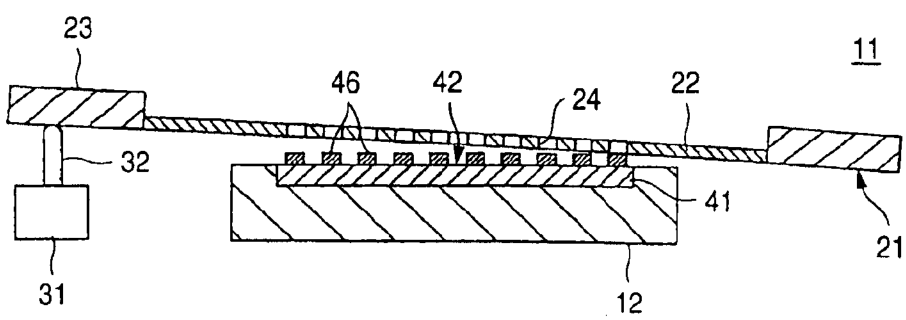
FIG. 4 is a schematic diagram showing the essential portion of the paste printing apparatus after a detaching action was completed.
Figure 5:
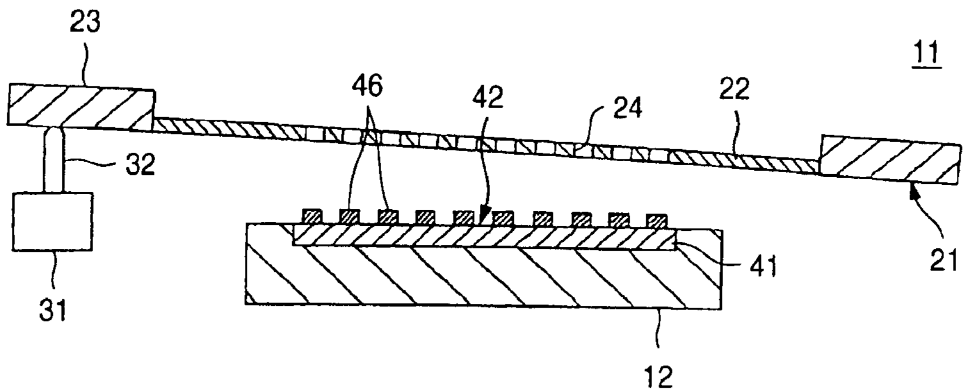
FIG. 5 is a schematic diagram showing the essential portion of the paste printing apparatus after a stage was lowered.

At the printing time, as shown in FIG. 2, the large-sized wiring substrate 41 or a printing object is held at first in the holding recess 13. After this, the table 12 is lifted to bring the printed face 42 of the wiring substrate 41 substantially into close contact with the mask plate 22. At this time, the inner face of the mask 21 and the printed face 42 of the wiring substrate 41 take a substantially parallel positional relation. Moreover, the individual through holes 24 of the mask 21 take positional relations corresponding to the individual openings 45 of the solder resist 44 (as referred to FIG. 6). Here, the pin 32 of the mask lifter 31 is still left submerged at this point of time.

Next, the squeezee driving means 27 is driven to move the squeezee 26 downward to bring the lower end edge of the squeezee 26 into contact with the movement starting side of the mask plate 22. The solder paste 47 is fed in a proper quantity by the not-shown paste feeding means to a position on the upper face of the mask plate 22 and on the forward side (i.e., on the righthand side of FIG. 2) of the squeezee 26. As the solder paste, there can be employed a well-known material such as a solder of Pb—Sn group, a solder of Sn—Ag group, a solder of Sn—Ag—Cu group or a solder of Sn—Zn group. Specifically in this embodiment, there is selected an eutectic solder of halogen-free type (Pb:Sn=63:37). This solder paste may be adjusted to a viscosity (at 23° C.) of 2,000 poises to 3,500 poises. If the paste viscosity is lower than 2,000 poises, a bridge may occur between the adjoining solder-printed layers thereby to raise the percentage of short failures. If the paste viscosity is higher than 3,500 poises, on the other hand, the filling properties of the paste may lower to deteriorate the shape of the solder-printed layers and may be unable to prevent the mask parting failure of the solder paste.

After the moving speed and the printing pressure were suitably set, moreover, the squeezee 26 is moved toward the mask face (e.g., from the lefthand side to the righthand side of FIG. 2). As a result, the solder paste 47 fills the insides of the through holes 24 thereby to form the flip chip bumps 46 (or the solder-printed layers) having a height corresponding to the thickness of the mask 21 (as referred to FIG. 3 and FIG. 7).

Next, the mask lifter 31 is driven at a predetermined timing to protrude the pin 32 upward at a predetermined speed. As a result, the mask 21, as arranged in a horizontal state over the printed face 42 of the wiring substrate 41, is lifted on one side so that its entirety comes into a slightly inclined state (as referred to FIG. 4 and FIG. 8). By this non-vertical detaching action, moreover, one side edge of the mask 21 is detached from the printed face 42. Then, the flip chip bumps 46 (or the solder-printed layers) come out of the through holes 24 of the mask 21 so that the detachment is completed. Here in FIG. 8, the inclination of the mask 21 is more emphatically illustrated than in the actual state.

When the table 12 is lowered (as referred to FIG. 5), moreover, the printed wiring substrate 41 can be taken out from the holding recess 13.

The wiring substrate 41 thus far subjected to the solder paste printing treatment is then subjected to a re-flow treatment under a predetermined condition and further to a pressing treatment to flatten the flip chip bumps 46 (or the solder-printed layers). As a result, the wiring substrate 41 having the flip chip bumps 46 (or the solder-printed layers) arranged in height and shape is completed, as shown in FIG. 9.

Therefore, the following effects can be obtained according to this embodiment.

Specifically, the non-vertical detaching method is adopted in this embodiment so that the flip chip bumps 46 (or the solder-printed layers) are peeled off sequentially from one side edge to the other side edge of the mask 21. Therefore, the magnitude of the peeling force can be made constant irrespective of the position in the printed face 42. Even on the large-sized wiring substrate 41, therefore, it is possible to form the flip chip bumps 46 (or the solder-printed layers) of a uniform thickness. Moreover, the wiring substrate 41 thus manufactured by that solder paste printing method has such a high quality as is excellent in the connection reliability.

Here, the embodiment of the invention may be modified in the following manners.

The detachment means should not be limited exclusively to the pressure means, as in the embodiment, for pushing one side edge of the mask 21 upward, but may be exemplified by pull-up means for pulling up one side of the mask 21.

The mask lifter 31 for lifting the one side edge of the mask 21 may be arranged by only one under the mask 21 on the movement starting side of the squeezee 26 or maybe arranged by two or more. Moreover, the mask lifter 31 can also be so constructed that it is arranged under the mask 21 on the movement ending side of the squeezee 26.

In order to realize the non-vertical detaching action, the construction may be modified such that the side of the table 12 is retracted downward while being obliquely inclined. With this construction, however, the structure is more complicated than that of the embodiment.

Next, the technical concepts to be grasped by the aforementioned embodiment will be enumerated in the following in addition to the technical concepts described at "SUMMARY OF THE INVENTION" of the specification.

(1) A method for manufacturing a wiring substrate having solder-printed layers, comprising: the step of arranging a plate-shaped mask having a plurality of through holes formed to correspond to a plurality of connection terminals, over a printed face of a substantially polygonal wiring substrate having one side of a length of at least 300 mm and having the connection terminals in the printed face; the step of forming solder-printed layers by moving a squeezee along the outer face of the mask while holding the squeezee in contact with the outer face of the mask, thereby to fill the through holes with a solder paste; and the step of detaching the mask by disengaging one side edge of the mask arranged over the printed face of the wiring substrate, relatively from the printed face, wherein the time period required for the action to detach the mask is at least 3.0 seconds. According to this method, therefore, solder-printed layers of a satisfactory shape can be obtained without being accompanied by a drop in the productivity.

(2) A method for manufacturing a wiring substrate having solder-printed layers, comprising: the step of arranging a plate-shaped mask having a plurality of through holes formed to correspond to a plurality of connection terminals, over a printed face of a substantially polygonal wiring substrate having one side of a length of at least 300 mm and having the connection terminals in the printed face; the step of forming solder-printed layers by moving a squeezee along the outer face of the mask while holding the squeezee in contact with the outer face of the mask, thereby to fill the through holes with a solder paste; and the step of detaching the mask by disengaging one side edge of the mask arranged over the printed face of the wiring substrate, relatively from the printed face, wherein the action to detach the mask is started after the squeezee passed through at least three quarters of the through hole forming region in the mask. According to this method, therefore, it is possible to prevent the dispersion in the solder-printed layers in the printed face in advance.

(3) A method for manufacturing a wiring substrate having solder-printed layers, comprising: the step of arranging a plate-shaped mask having a plurality of through holes formed to correspond to a plurality of connection terminals, over a printed face of a substantially polygonal wiring substrate having one side of a length of at least 300 mm and having the connection terminals in the printed face; the step of forming solder-printed layers by moving a squeezee along the outer face of the mask while holding the squeezee in contact with the outer face of the mask, thereby to fill the through holes with a solder paste; and the step of detaching the mask by disengaging one side edge of the mask arranged over the printed face of the wiring substrate, relatively from the printed face, wherein the moving speed of the squeezee is 20 mm/sec. at most. According to this method, therefore, the parting failure of the solder paste can be reliably prevented without being accompanied by a drop in the productivity.

(4) A method for manufacturing a wiring substrate having solder-printed layers, comprising: the step of arranging a plate-shaped mask having a plurality of through holes formed to correspond to a plurality of connection terminals, over a printed face of a substantially polygonal wiring substrate having one side of a length of at least 300 mm and having the connection terminals in the printed face; the step of forming solder-printed layers by moving a squeezee along the outer face of the mask while holding the squeezee in contact with the outer face of the mask, thereby to fill the through holes with a solder paste; and the step of detaching the mask by disengaging one side edge of the mask arranged over the printed face of the wiring substrate, relatively from the printed face, wherein the printing pressure of the squeezee is 8.5 Kgf or more. According to this method, therefore, the parting failure of the solder paste can be reliably prevented while avoiding the premature wears of parts or the breakage of the wiring substrate.

(5) A method for manufacturing a wiring substrate having solder-printed layers, comprising: the step of arranging a plate-shaped mask having a plurality of through holes formed to correspond to a plurality of connection terminals, over a printed face of a substantially polygonal wiring substrate having one side of a length of at least 300 mm and having the connection terminals in the printed face; the step of forming solder-printed layers by moving a squeezee along the outer face of the mask while holding the squeezee in contact with the outer face of the mask, thereby to fill the through holes with a solder paste; and the step of detaching the mask by disengaging one side edge of the mask arranged over the printed face of the wiring substrate, relatively from the printed face, wherein the magnitude of the gap between the printed face of the wiring substrate and the mask after the detaching action was completed is 3 mm at most in the vicinity of the movement starting position of the squeezee and 2 mm at most in the vicinity of the movement ending position of the squeezee. According to this method, therefore, the solder-printed layers can be reliably detached in the entirety of the squeezee moving direction.

(6) A solder paste printing apparatus comprising: a wiring substrate holder for holding a substantially polygonal wiring substrate having one side of a length of at least 300 mm and a plurality of connection terminals in a printed face; a plate-shaped mask having a plurality of through holes formed to correspond to the connection terminals and arranged over the printed face of the wiring substrate; a squeezee for moving along the outer face of the mask while being held in contact with the outer face of the mask, to fill the through holes with a solder paste thereby to form solder-printed layers; and detachment means including pressure means for pushing one side edge or its vicinity of the mask arranged over the printed face of the wiring substrate, to disengage the one side edge of the mask relatively from the printed face thereby to detach the mask. According to this apparatus, therefore, the non-vertical detaching action can be realized by a relatively simpler construction than that of the case in which the wiring substrate holder side is driven.

(7) A solder paste printing apparatus comprising: a wiring substrate holder for holding a substantially polygonal wiring substrate having one side of a length of at least 300 mm and a plurality of connection terminals in a printed face; a plate-shaped mask having a plurality of through holes formed to correspond to the connection terminals and arranged over the printed face of the wiring substrate; a squeezee for moving along the outer face of the mask while being held in contact with the outer face of the mask, to fill the through holes with a solder paste thereby to form solder-printed layers; and detachment means including pressure means for pushing the movement starting side of the squeezee of the mask arranged over the printed face of the wiring substrate, upward to disengage the one side edge of the mask relatively from the printed face thereby to detach the mask. According to this apparatus, therefore, the apparatus can be avoided from become complicated, without requiring a squeezee retracting structure.

(8) In the technical concept (6) or (7), the speed for the pressure means to push the mask is 0.9 mm/sec. at most. According to this construction, solder-printed layers of a satisfactory shape can be obtained without being accompanied by a drop in the productivity.

(9) A method for manufacturing a wiring substrate having flip chip bumps, comprising: the step of arranging a plate-shaped mask having a plurality of through holes formed to correspond to a plurality of connection terminals, over a printed face of a substantially polygonal wiring substrate having one side of a length of at least 300 mm and having the connection terminals in the printed face covered with a solder resist having openings; the step of forming flip chip bumps protruding from the solder resist surface, by moving a squeezee at a moving speed of 20 mm/sec. at most along the outer face of the mask while holding the squeezee under a printing pressure of 7.5 Kgf or more in contact with the outer face of the mask, thereby to fill the through holes with a solder paste; and the step of detaching the mask by disengaging one side edge of the mask arranged over the printed face of the wiring substrate, relatively from the printed face.

(10) A method for manufacturing a wiring substrate having flip chip bumps, comprising: the step of arranging a plate-shaped mask having a plurality of through holes formed to correspond to a plurality of connection terminals, over a printed face of a substantially polygonal wiring substrate having one side of a length of at least 300 mm and having the connection terminals in the printed face covered with a solder resist having openings; the step of forming flip chip bumps protruding from the solder resist surface, by moving a squeezee along the outer face of the mask while holding the squeezee in contact with the outer face of the mask, thereby to fill the through holes with a solder paste; and the step of detaching the mask for a predetermined time period of at least 3.0 seconds by pushing the movement starting side of the mask arranged over the printed face of the wiring substrate, upward at a speed of 0.9 mm/sec. at most after the squeezee passed through at least three quarters of the through holes forming region in the mask, thereby to disengage one side edge of the mask relatively from the printed face.

(11) A solder paste printing method comprising: the step of arranging a plate-shaped mask having a plurality of through holes formed to correspond to a plurality of connection terminals, over a printed face of a substantially polygonal wiring substrate having one side of a length of at least 300 mm and having the connection terminals in the printed face; the step of forming solder-printed layers by moving a squeezee along the outer face of the mask while holding the squeezee in contact with the outer face of the mask, thereby to fill the through holes with a solder paste; and the step of detaching the mask by disengaging one side corner of the mask arranged over the printed face of the wiring substrate, relatively from the printed face.

(12) A method for manufacturing a wiring substrate having solder-printed layers, comprising: the step of arranging a plate-shaped mask having a plurality of through holes formed to correspond to a plurality of connection terminals, over a printed face of a substantially polygonal wiring substrate having one side of a length of at least 300 mm and having the connection terminals in the printed face; the step of forming solder-printed layers by moving a squeezee along the outer face of the mask while holding the squeezee in contact with the outer face of the mask, thereby to fill the through holes with a solder paste; and the step of detaching the mask by a non-vertical detaching method, in which the angle of inclination of the inner face of the mask is gradually increased with respect to the printed face.

(13) A solder paste printing method comprising: the step of arranging a plate-shaped mask having a plurality of through holes formed to correspond to a plurality of connection terminals, over a printed face of a substantially polygonal wiring substrate having one side of a length of at least 300 mm and having the connection terminals in the printed face; the step of forming solder-printed layers by moving a squeezee along the outer face of the mask while holding the squeezee in contact with the outer face of the mask, thereby to fill the through holes with a solder paste; and the step of detaching the mask by disengaging one side end (or one side edge) of the mask arranged over the printed face of the wiring substrate, relatively from the printed face.

(14) A method for manufacturing a wiring substrate having solder-printed layers, comprising: the step of arranging a plate-shaped mask having a plurality of through holes formed to correspond to a plurality of connection terminals, over a printed face of a substantially polygonal wiring substrate having one side of a length of at least 300 mm and having the connection terminals in the printed face; the step of forming solder-printed layers by moving a squeezee along the outer face of the mask while holding the squeezee in contact with the outer face of the mask, thereby to fill the through holes with a solder paste; and the step of detaching the mask by a non-vertical detaching method, in which peeling forces are not applied all at once to the solder-printed layers at a detaching time.

(15) A method for manufacturing a wiring substrate having solder-printed layers, comprising: the step of arranging a plate-shaped mask having a plurality of through holes formed to correspond to a plurality of connection terminals, over a printed face of a substantially polygonal wiring substrate having one side of a length of at least 300 mm and having the connection terminals in the printed face; the step of forming solder-printed layers by moving a squeezee along the outer face of the mask while holding the squeezee in contact with the outer face of the mask, thereby to fill the through holes with a solder paste; and the step of detaching the mask by a non-vertical detaching method, in which no difference of the magnitudes of peeling forces occurs among the positions in the printed face.

(16) A method for manufacturing a wiring substrate having solder-printed layers, comprising: the step of arranging a plate-shaped mask having a plurality of through holes formed to correspond to a plurality of connection terminals, over a printed face of a substantially polygonal wiring substrate having one side of a length of at least 300 mm and having the connection terminals in the printed face; the step of forming solder-printed layers by moving a squeezee along the outer face of the mask while holding the squeezee in contact with the outer face of the mask, thereby to fill the through holes with a solder paste; and the step of detaching the mask by a non-vertical detaching method, in which the solder-printed layers are sequentially peeled from one side edge to the other side edge of the mask.

(17) A method for manufacturing a wiring substrate having solder-printed layers, comprising: the step of arranging a plate-shaped mask having a plurality of through holes formed to correspond to a plurality of connection terminals, over a printed face of a substantially polygonal wiring substrate having one side of a length of at least 300 mm and having the connection terminals in the printed face; the step of forming solder-printed layers by moving a squeezee along the outer face of the mask while holding the squeezee in contact with the outer face of the mask, thereby to fill the through holes with a solder paste; and the step of detaching the mask by a non-vertical detaching method, in which the detachment is done while keeping the magnitude of peeling forces substantially constant irrespective of positions in the printed face.

(18) A solder paste printing method comprising: the step of arranging a mask having a plurality of through holes formed to correspond to a plurality of connection terminals, over a printed face of a rectangular wiring substrate having one side of a length of at least 300 mm and having the connection terminals in the printed face; the step of forming solder-printed layers by moving a squeezee in a mask plane direction while holding the squeezee in contact with the outer face of the mask, thereby to fill the through holes with a solder paste; and the step of detaching the mask by disengaging one side of the mask arranged over the printed face of the wiring substrate, relatively from the printed face.

(19) A solder paste printing apparatus comprising: a wiring substrate holder for holding a rectangular wiring substrate having one side of a length of at least 300 mm and a plurality of connection terminals in a printed face; a mask having a plurality of through holes formed to correspond to the connection terminals and arranged over the printed face of the wiring substrate; a squeezee for moving in a mask plane direction while being held in contact with the outer face of the mask, to fill the through holes with a solder paste thereby to form solder-printed layers; and detachment means for disengaging one side of the mask arranged over the printed face of the wiring substrate, relatively from the printed face thereby to detach the mask.

(20) A method for manufacturing a wiring substrate having solder-printed layers, comprising: the step of arranging a mask having a plurality of through holes formed to correspond to a plurality of connection terminals, over a printed face of a rectangular wiring substrate having one side of a length of at least 300 mm and having the connection terminals in the printed face; the step of forming solder-printed layers by moving a squeezee in a mask plane direction while holding the squeezee in contact with the outer face of the mask, thereby to fill the through holes with a solder paste; and the step of detaching the mask by disengaging one side of the mask arranged over the printed face of the wiring substrate, relatively from the printed face.

EXAMPLES

Here will be introduced several examples, which are more specified from this embodiment.

Example 1

Here, Example 1 is located in that the non-vertical detaching action was done by the mask lifter 31 after the printing operation using the paste printing apparatus 11. The printing object or the large-sized wiring substrate 41 had a size of 410 mm square. Moreover, a solder paste containing an eutectic solder was used as the solder paste 47.

In Example 1, the printing pressure (as specified by the measured value of the load cell 29) of the squeezee 26 was set at 8.15 Kgf, and the moving speed of the squeezee 26 was set at 17 mm/sec. Moreover, the squeezee 26 had a length of 420 mm; the pin 32 had a protrusion of 3 mm; the pin 32 had a protruding speed of 0.4 mm/sec.; and the detaching action was started after the pattern printing.

On the other hand, Comparisons 1A to 1E (of the prior art) are located in that the vertical detaching action was done by lowering the table 12 after the printing operation using that paste printing apparatus 11. These Comparisons 1A to 1E adopted the following printing conditions.

Specifically in Comparison 1A, the printing pressure of the squeezee 26 was set at 7.15 Kgf, and the moving speed of the squeezee 26 was set at 17 mm/sec. In Comparison 1B, the printing pressure of the squeezee 26 was set at 8.15 Kgf, and the moving speed of the squeezee 26 was set at 10 mm/sec. In Comparison 1C, the printing pressure of the squeezee 26 was set at 8.15 Kgf, and the moving speed of the squeezee 26 was set at 17 mm/sec. In Comparison 1D, the printing pressure of the squeezee 26 was set at 8.15 Kgf, and the moving speed of the squeezee 26 was set at 25 mm/sec. In Comparison 1E, the printing pressure of the squeezee 26 was set at 9.15 Kgf, and the moving speed of the squeezee 26 was set at 17 mm/sec. Here, individual Comparisons 1A to 1E basically shared the several conditions other than the aforementioned two items. Specifically: the squeezee 26 had a length of 420 mm; the table 12 had a downward stroke of 3 mm at the vertical detaching time; the table 12 had a lowering speed of 0.6 mm/sec.; and the detaching action was started after the pattern printing.

After the ends of the printing and detaching actions, moreover, the quantity (g/panel) of transcription, the number of bridges formed and the number of parting failures were examined and compared by the methods known in the art. The results are enumerated in Table 1 below.

TABLE 1

| | PRINTING PRESSURE (Kgf) | SQUEEZEE MOVING SPEED (mm/sec.) | DETACHING MODE | TRANSCRIPTION QUANTITY (g/panel) | BRIDGE (pcs) | PARTING FAILURE (pcs) |
|---|---|---|---|---|---|---|
| EXAMPLE 1 | 8.15 | 17 | NON-VERTICAL | 1.23 | 0/484 | 0/484 |
| COMPARISON 1A | 7.15 | 17 | VERTICAL | 1.23 | 0/484 | 3/484 |
| COMPARISON 1B | 8.15 | 10 | VERTICAL | 1.22 | 0/484 | 0/484 |
| COMPARISON 1C | 8.15 | 17 | VERTICAL | 1.23 | 0/484 | 0/484 |
| COMPARISON 1D | 8.15 | 25 | VERTICAL | 1.16 | 0/484 | 14/484 |
| COMPARISON 1E | 9.15 | 17 | VERTICAL | 1.20 | 0/484 | 0/484 |

According to these investigations, neither any bridge nor any parting failure occurred in Example 1. On the contrary, the occurrence of the parting failures of the solder paste 47 was confirmed in Comparison 1A, in which the printing pressure of the squeezee 26 had been set lower than those of others, and Comparison 1D, in which the moving speed of the squeezee 26 had been set higher than those of others.

On the other hand, each pad was set at a pressure of 0.53 Kg, and the flattening treatment was done by a pressing treatment at 100° C. for 2 seconds. After this, the flip chip bumps 46 (or the solder-printed layers) were measured at a plurality of portions on the flat height (in μm) and the flat diameter (in μm). As a result, little difference was resulted from the difference in the position along the moving direction of the squeezee 26 in connection with the flat height and the flat diameter, even if Example 1 and Comparisons 1A to 1E were compared. In connection with the flat diameter, moreover, little difference was either resulted from the difference in the position along the direction (i.e., the longitudinal direction of the squeezee 26) perpendicular to the moving direction of the squeezee 26.

On the two objects of Example 1 and Comparison 1C, moreover, the appearance of the flip chip bumps 46 (or the solder-printed layers) after the pressing step was investigated at a plurality of portions, and the investigation results were compared. As a result, in Example 1, the shapes of the flip chip bumps 46 (or the solder-printed layers) were very well arranged, and little dispersion was recognized among the positions. In Comparison 1C, on the contrary, a dispersion in the flat diameter was confirmed on the center column with respect to the moving direction of the squeezee 26.

By synthesizing the results thus far described, it has been clarified that the conditions of Example 1 may be adopted for forming the flip chip bumps 46 (or the solder-printed layers) of a uniform thickness for the large-sized wiring substrate 41.

Example 2

Here, comparison will be made between Examples 2A and 2B. In Example 2A, the length of the squeezee 26 was set at 420 mm as in the printing apparatus of the prior art, and the printing pressure of the squeezee 26 was set at 8.15 Kgf. In Example 2B, the length of the squeezee 26 was set longer at 450 mm, and the printing pressure of the squeezee 26 was set at 8.80 Kgf. The remaining several conditions basically accorded to those of Example 1.

After the ends of the printing and detaching actions, moreover, the quantity (g/panel) of transcription, the number of bridges formed and the number of parting failures were examined and compared by the methods known in the art. The results are enumerated in Table 2 below. On these investigation items, however, no prominent difference was recognized between Examples 2A and 2B.

TABLE 2

| | DETACHMENT STARTING POSITION (mm) | PIN PROTRUDING SPEED (mm/sec.) | SQUEEZEE LENGTH (mm) | PRINTING PRESSURE (Kgf) | TRANSCRIPTION QUANTITY (g/panel) | BRIDGE (pcs) | PARTING FAILURE (pcs) |
|---|---|---|---|---|---|---|---|
| EXAMPLE 2A | 450 | 0.4 | 420 | 8.15 | 1.22 | 0/484 | 0/484 |
| EXAMPLE 2B | 450 | 0.4 | 450 | 8.80 | 1.23 | 0/484 | 0/484 |

Next, the height (in $\mu$m) of the flip chip bumps 46 (or the solder-printed layers) was measured at a plurality of portions. In Example 2A having the squeezee 26 shortened relatively, it has been found that the end columns had the smaller height than that of the central column with reference to the moving direction of the squeezee 26. In Example 2B having the squeezee 26 elongated relatively, on the other hand, it has been found that the height of the flip chip bumps 46 (or the solder-printed layers) in the end columns increased to eliminate the height dispersion substantially, in dependence upon the position. The following presumption was made for that reason. It has been presumed that, although the distance from the end edge of the through hole forming region in the mask 21 to the squeezee end was short in Example 2A, the distance was so long in Example 2B that the printing could be stabilized.

Example 3

Here are compared Examples 3A, 3B, 3C, 3D and 3E.

In Example 3A, the protrusion of the pin 32 was set at 1 mm so that the gap between the inner face of the mask 21 after the detaching action and the printed face 42 of the wiring substrate 41 was about 0.725 mm in the vicinity of the movement starting end position of the squeezee 26 and about 0.475 mm in the vicinity of the movement ending position of the squeezee 26. In Example 3B, the protrusion of the pin 32 was set at 2 mm so that the aforementioned gap was about 1.450 mm in the vicinity of the movement starting end position of the squeezee 26 and about 0.950 mm in the vicinity of the movement ending position of the squeezee 26. In Example 3C, the protrusion of the pin 32 was set at 3 mm so that the aforementioned gap was about 2.176 mm in the vicinity of the movement starting end position of the squeezee 26 and about 1.424 mm in the vicinity of the movement ending position of the squeezee 26. In Example 3D, the protrusion of the pin 32 was set at 5 mm so that the aforementioned gap was about 3.626 mm in the vicinity of the movement starting end position of the squeezee 26 and about 2.374 mm in the vicinity of the movement ending position of the squeezee 26. The remaining several conditions were basically set according to those of Example 1. However, the detaching action accompanying the protrusion of the pin 32 was started before the squeezee 26 had not passed more than half of the through hole forming region. Specifically, the detaching action was started when the squeezee 26 moved by 110 mm from the starting point (as referred to Table 3 below).

TABLE 3

| | DETACHMENT STARTING POSITION (mm) | PIN PROTRUDING SPEED (mm/sec.) | PIN PROTRUSION (mm) | GAP (mm) | |
|---|---|---|---|---|---|
| | | | | STARTING END | TERMINAL END |
| EXAMPLE 3A | 110 | 0.4 | 1 | 0.725 | 0.475 |
| EXAMPLE 3B | 110 | 0.4 | 2 | 1.450 | 0.950 |
| EXAMPLE 3C | 110 | 0.4 | 3 | 2.176 | 1.424 |
| EXAMPLE 3D | 110 | 0.4 | 5 | 3.626 | 2.374 |
| EXAMPLE 3E | 450 | 0.4 | 3 | 2.176 | 1.424 |

The mask lifter 31 was driven to protrude the pin 32 by a predetermined stroke, and it was confirmed whether or not the detachments were individually proper. As a result, it was confirmed that the detachments were imperfect for Examples 3A and 3B having a small lift of the mask 21 but were perfect for Examples 3C and 3D.

After the ends of the printing and detaching actions, moreover, the quantity (g/panel) of transcription, the number of bridges formed and the number of parting failures were examined by the methods known in the art. The results are enumerated in Table 4 below. On the aforementioned individual investigation items, however, no prominent difference was recognized among Examples 3A to 3D.

TABLE 4

| | DETACHMENT PROPRIETY | TRANSCRIPTION QUANTITY (g/panel) | BRIDGE (pcs) | PARTING FAILURE (pcs) |
|---|---|---|---|---|
| EXAMPLE 3A | Imperfect | 1.15 | 0/484 | 0/484 |
| EXAMPLE 3B | Imperfect | 1.13 | 0/484 | 0/484 |
| EXAMPLE 3C | Perfect | 1.16 | 0/484 | 0/484 |
| EXAMPLE 3D | Perfect | 1.17 | 0/484 | 0/484 |
| EXAMPLE 3E | Perfect | 1.23 | 0/484 | 0/484 |

Moreover, Example 3E (identical to Example 1) was set such that the detaching action was started after the squeezee 26 had passed substantially through the through hole forming region, that is, the detaching action was started when the squeezee 26 had moved by 450 mm from the starting point. Moreover, Example 3E was compared with Example 3C to reveal that the transcription quantity was more in Example 3E. Moreover, Example 3C had a tendency, in which the printing thickness and the flat diameter became the smaller for the closer position in the moving direction of the squeezee 26. However, this tendency was not recognized in Example 3E.

Moreover, the appearance tests were done on the flip chip bumps 46 (or the solder-printed layers) just after printed. In Example 3C, it has been recognized that the center column with respect to the moving direction of the squeezee 26 had a tendency to become a dome shape thereby to make the printing unstable. In Example 3E, on the contrary, that tendency was not recognized in particular.

Synthesizing the results thus far described, it has been clarified that the conditions of Examples 3C, 3D and 3E may be adopted for forming the flip chip bumps 46 (or the solder-printed layers) of a uniform thickness for the large-sized wiring substrate 41, and that especially the conditions of Example 3E may be well adopted.

Example 4

Here are compared Examples 4A, 4B, 4C and 4D.

In Example 4A, the protruding speed of the pin 32 was set at 0.1 mm/sec. so that the time period required for the detaching action was 30.0 secs. In Example 4B, the protruding speed of the pin 32 was set at 0.4 mm/sec. so that the time period required for the detaching action was 7.5 secs. In Example 4C, the protruding speed of the pin 32 was set at 0.7 mm/sec. so that the time period required for the detaching action was 4 secs. In Example 4D, the protruding speed of the pin 32 was set at 1.1 mm/sec. so that the time period required for the detaching action was 2.7 secs. The remaining several conditions were basically set according to those of Example 1.

After the ends of the printing and detaching actions, the quantity (g/panel) of transcription, the number of bridges formed and the number of parting failures were examined and compared by the methods known in the art. The results are enumerated in Table 5 below. On the aforementioned individual investigation items, however, no prominent difference was recognized among Examples 4A to 4D, all of which exhibited satisfactory results.

TABLE 5

| | DETACHMENT STARTING POSITION (mm) | PIN PROTRUSION (mm) | PIN PROTRUDING SPEED (mm/sec.) | TIME PERIOD FOR DETACHMENT (sec.) | TRANSCRIPTION QUANTITY (g/panel) | BRIDGE (pcs) | PARTING FAILURE (pcs) |
|---|---|---|---|---|---|---|---|
| EXAMPLE 4A | 450 | 3 | 0.1 | 30.0 | 1.23 | 0/484 | 0/484 |
| EXAMPLE 4B | 450 | 3 | 0.4 | 7.5 | 1.21 | 0/484 | 0/484 |
| EXAMPLE 4C | 450 | 3 | 0.7 | 4.0 | 1.22 | 0/484 | 0/484 |
| EXAMPLE 4D | 450 | 3 | 1.1 | 2.7 | 1.22 | 0/484 | 0/484 |

However, the appearance tests were done on the flip chip bumps 46 (or the solder-printed layers) just after printed. In Example 4C having the protruding speed set higher than those of the remaining ones, it has been recognized that the center column with respect to the moving direction of the squeezee 26 had a tendency to become a dome shape thereby to make the printing unstable. In Examples 4A, 4B and 4C, on the contrary, that tendency was not recognized in particular.

Synthesizing the results thus far described, it has been clarified that the conditions of Examples 4A, 4B and 4C may be adopted for forming the flip chip bumps 46 (or the solder-printed layers) of a uniform thickness for the large-sized wiring substrate 41.

This application is based on Japanese Patent application JP 2003-333578, filed Sep. 25, 2003, and Japanese Patent application JP 2002-304848, filed Oct. 18, 2002, the entire contents of which are hereby incorporated by reference, the same as if set forth at length.

What is claimed is:

1. A solder paste printing method comprising the steps of:

disposing a plate-shaped mask having a through hole forming region having a plurality of through holes formed to correspond to a plurality of connection terminals, over a printed face of a substantially polygonal wiring substrate having a side of a length of at least 300 mm and having the connection terminals in the printed face;

forming solder-printed layers by moving a squeegee along an outer face of the mask while holding the squeegee in contact with the outer face of the mask, thereby to fill the through holes with a solder paste; and detaching the mask by disengaging one side edge of the mask disposed over the printed face of the wiring substrate only after the squeegee has passed through three quarters or more of the through hole forming region in the mask, relatively from the printed face.

2. The method according to claim 1, wherein a speed of the moving of the squeegee is at 20 mm/sec or less.

3. The method according to claim 1, wherein a printing pressure of the squeegee is at 7.5 Kgf or more.

4. The method according to claim 1, which comprises detaching the mask only after the squeegee has passed completely over the through hole forming region in the mask.

5. A solder paste printing apparatus comprising:

a wiring substrate holder for holding a substantially polygonal wiring substrate having a side of a length of at least 300 mm and a plurality of connection terminals in a printed face;

a plate-shaped mask having a through hole forming region having a plurality of through holes formed to correspond to the connection terminals, which is to be disposed over the printed face of the wiring substrate;

a squeegee for moving along an outer face of the mask while being held in contact with the outer face of the mask, to fill the through holes with a solder paste thereby to form solder-printed layers; and detachment means for disengaging one side edge of the mask disposed over the printed face of the wiring substrate only after the squeegee has passed through three quarters or more of the through hole forming region in the mask, relatively from the printed face thereby to detach the mask.

6. The solder paste printing apparatus according to claim 5, wherein a speed of the moving of the squeegee is at 20 mm/sec or less.

7. The solder paste printing apparatus according to claim 5, wherein a printing pressure of the squeegee is at 7.5 Kgf or more.

8. The apparatus according to claim 5, wherein said detachment means comprises means for disengaging one side of the mask disposed over the printed face of the wiring substrate only after the squeegee has passed completely over the through hole forming region in the mask.

9. A method for manufacturing a wiring substrate having solder-printed layers, comprising the steps of:

disposing a plate-shaped mask having a through hole forming region having a plurality of through holes formed to correspond to a plurality of connection terminals, over a printed face of a substantially polygonal wiring substrate having a side of a length of at least 300 mm and having the connection terminals in the printed face;

forming solder-printed layers by moving a squeegee along an outer face of the mask while holding the squeegee in contact with the outer face of the mask, thereby to fill the through holes with a solder paste; and detaching the mask by disengaging one side edge of the mask disposed over the printed face of the wiring substrate only after the squeegee has passed through three quarters or more of the through hole forming region in the mask, relatively from the printed face.

10. The method according to claim 9, wherein a speed of the moving of the squeegee is at 20 mm/sec or less.

11. The method according to claim 9, wherein a printing pressure of the squeegee is at 7.5 Kgf or more.

12. The method according to claim 9, wherein the printed face is covered with a solder resist having openings, the solder-printed layers are flip chip bumps formed over the connection terminals exposed through the openings, and a protrusion height of the flip chip bumps from a surface of the solder resist is at least 20 $\mu$m.

13. The method according to claim 12, wherein the solder resist has a thickness of at least 5 $\mu$m.

14. The method according to claim 12, wherein the solder resist has a thickness of at least 10 $\mu$m.

15. The method according to claim 9, which comprises detaching the mask only after the squeegee has passed completely over the through hole forming region in the mask.

* * * * *